United States Patent [19]

Velsher et al.

[11] Patent Number: 4,527,848

[45] Date of Patent: Jul. 9, 1985

[54] HIGH DENSITY LOW PROFILE MULTIPLE CONTACT CONNECTOR

[75] Inventors: Benne Velsher, Ottawa; Jaroslav M. Hvezda, Nepean; Richard J. Middlehurst, Kanata, all of Canada

[73] Assignee: Northern Telecom Limited, Montreal, Canada

[21] Appl. No.: 566,037

[22] Filed: Dec. 27, 1983

[51] Int. Cl.[3] .................... H01R 13/64; H01R 13/645; H01R 13/506; H05K 1/00

[52] U.S. Cl. ............................ 339/17 M; 339/75 MP; 339/91 R; 339/176 MP; 339/186 M

[58] Field of Search ........ 339/17 CF, 17 LC, 17 LM, 339/17 M, 186 R, 186 M, 176 M, 176 MP, 184 R, 184 M; 361/412–415; 339/17 N, 75 M, 75 MP, 91 R

[56] References Cited

U.S. PATENT DOCUMENTS

| | | | |
|---|---|---|---|
| 3,736,471 | 5/1973 | Donze et al. | 339/17 LM X |
| 3,905,670 | 9/1975 | Anhalt et al. | 339/176 MP X |
| 3,960,424 | 6/1976 | Weisenburger | 339/17 M |
| 4,330,163 | 5/1982 | Aikens et al. | 339/17 CF |
| 4,350,403 | 9/1982 | Seytre et al. | 339/91 R |

FOREIGN PATENT DOCUMENTS

| | | | |
|---|---|---|---|
| 2413989 | 9/1974 | Fed. Rep. of Germany | 339/19 |

*Primary Examiner*—Gil Weidenfeld
*Assistant Examiner*—Steven C. Bishop
*Attorney, Agent, or Firm*—Sidney T. Jelly

[57] ABSTRACT

A multiple contact connector having a low profile has a bottom member for attachment to a large circuit board, the bottom member having a plurality of spaced parallel spring cantilever contact members. A top member is attached to an edge of another circuit board, for example a smaller board, the top member having a plurality of spaced parallel contact members of U shape, the top legs of the contact member making contact with the smaller board circuit pattern and the bottom legs contacting the cantilever contact members of the bottom member. A spring member extends up from the bottom member and snaps over the top member.

12 Claims, 13 Drawing Figures

HIGH DENSITY LOW PROFILE MULTIPLE CONTACT CONNECTOR

This invention relates to a high density low profile multiple contact connector. Such a connector is particularly applicable to circuit boards. A particular use is for mounting sub-boards, often referred to as daughter boards, on a large circuit board, often referred to as a mother board. The invention is particularly applicable to telecommnications systems.

It is quite common to require the mounting of so-called daughter boards on the larger so-called mother boards. Electrical and electronic components are mounted on a daughter board which is then mounted on the mother board. With the increased density which is being achieved, the number of contacts, or connections, to be made between mother board and daughter is very high. In many cases it is desired to mount daughter boards on mother boards which must fit in very restricted spaces in a frame. In fact, the space available is often the same as for a circuit board carrying components directly on the board. Thus what can be termed the vertical height, that is the distance normal to the plane of the mother board, is severely restricted. This causes problems in providing connectors on the mother board for connection of the daughter boards.

The present invention provides a connector which has a very low height or profile, extends only a very minimal distance beyond the periphery of a daughter, permitting other daughter boards to be mounted very close. The connector has a high density contact arrangement, provides snap-in mounting and can be provided with keying to ensure correct orientation of a daughter board on the mother board.

Broadly, a connector in accordance with the invention comprises a bottom member for attachment to a large circuit board and including a plurality of spring cantilever contact members spaced apart along the bottom member, the contact members including tail portions extending through the bottom member for passage through the large circuit board, a spring latch member extending upward along an edge of the bottom member, a top member for attachment to the edge of a smaller circuit board, the top member having a plurality of contact members spaced apart, each having one end positioned to engage with contact pads on an upper surface of the smaller board and the other end positioned to contact a spring cantilever contact member on said bottom member, said spring latch member engaging over the top member when said top and bottom members are in engagement.

Normally a connector is provided on opposite sides of a smaller board, the springs retaining the smaller board in position on the larger board.

The invention will be readily understood by the following description of certain embodiments, in conjunction with the accompanying drawings, in which.

Figure 1:
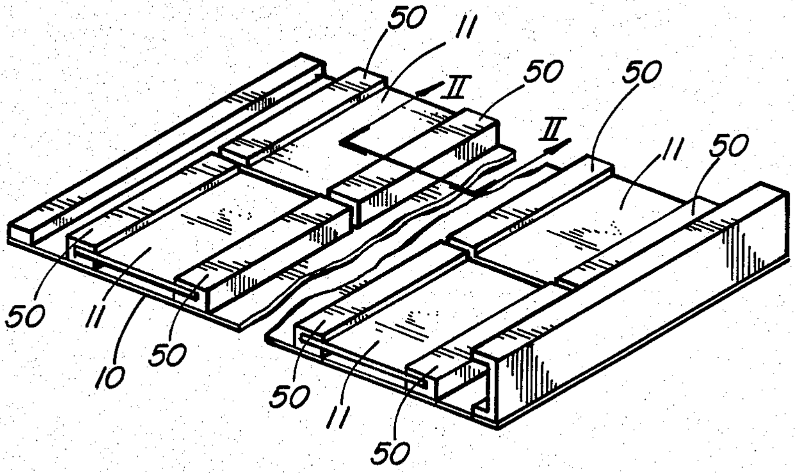
FIG. 1 is a perspective view of a large, or mother, board with several smaller, or daughter, boards mounted thereon.

FIG. 1 illustrates a relatively large circuit board 10, hereafter referred to as the mother board, on which are mounted a series of small boards 11, hereafter referred to as daughter boards. One example of use of such arrangements is in telecommunications systems. Components and devices of various types are mounted and/or formed on the daughter boards. As the density of mounting of such components and devices, and as the density of components in a device, such as large scale and very large scale integrated circuit devices increases, the problem of providing connections and interconnections to the components and devices becomes more difficult. In the arrangement as in FIG. 1, conductor patterns are formed on the mother board with contact positions to which contact is to be made from daughter boards. The conductor patterns on the mother board interconnect the daughter boards and also provide input and output connections to other parts of a system.

To obtain as high a density as possible on the mother board, very close positioning of the daughter boards is desired. At the same time, it is necessary to keep the overall height of any connector to a minimum. Often the mother boards are to be inserted into frames having a preset pitch between boards. Thus the connectors must have a low profile. As illustrated in FIG. 1, with connectors in accordance with the present invention, daughter boards can be mounted with minimal clearance. The connectors in FIG. 1 are only illustrated in a generalized form, being shown in more detail in FIGS. 2 to 13.

Figure 2:
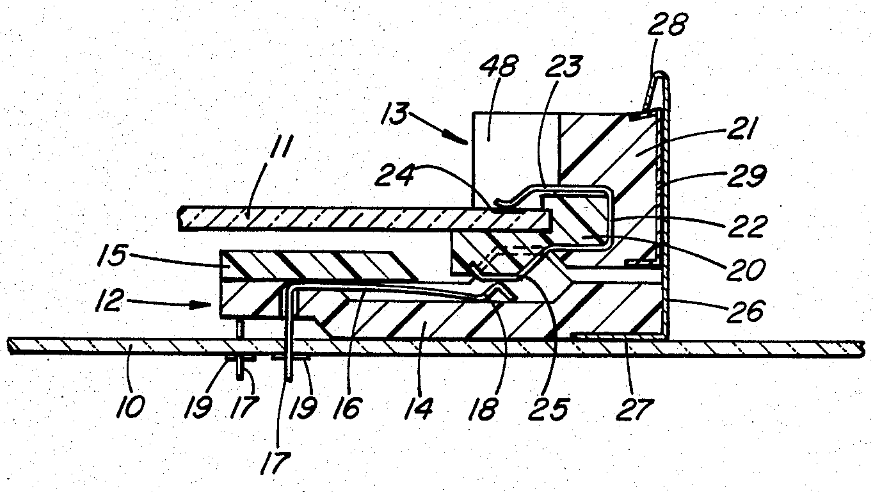
FIG. 2 is a cross-section through a connector, on a mother board with a daughter board, on the line II—II of FIG. 1.

FIG. 2 is a cross-section through one edge of a daughter board and part of a mother board, and a connector. The connector has two assemblies or main members, an elongate bottom member 12 and an elongate top member 13. The bottom member 12 has two parts, a base 14 and a cap 15. Between the base and the cap are held a plurality of contacts 16. The contacts 16 have tail portions 17 which pass through the mother board 10 and can be soldered to conductor patterns 19 on the under surface of the mother board. The contacts 16 also have spring cantilever contact portions 18. The base is attached to the mother board 10.

The top member 13 also has a base 20, extending along one edge of the daughter board, and a channel shaped member 21 which fits over the edge of the base 20. Between the base 20 and channel member 21 are held a plurality of contacts 22. The contacts 22 are generally U-shaped, having a top leg 23 which extends over the top surface of the daughter board 11 with the ends of the legs soldered to contact pads on the daughter board, as illustrated at 24. A bottom leg 25 of each contact 22 extends beneath the base 20, and makes contact with the cantilever contact portion 18 of a related contact 16.

A spring member 26 has its lower end 27 bent to extend under the base 14 of the bottom member 12. The spring member extends up past the edges of the base 14 and the channel member 21 and has a top portion bent over in the form of a hook 28. The hook 28 snaps over the top of the channel member 21 and holds the top member 13 on the bottom member 12. This maintains connections between the contacts 16 and 22. A connector is provided at the opposite edges of a daughter board and then the daughter board is held in position on the mother board. If desired, a metal protector member 29 can be provided on the channel member 21. The top member 13, and the daughter board, are released by pulling back the spring member 26.

Figure 3:
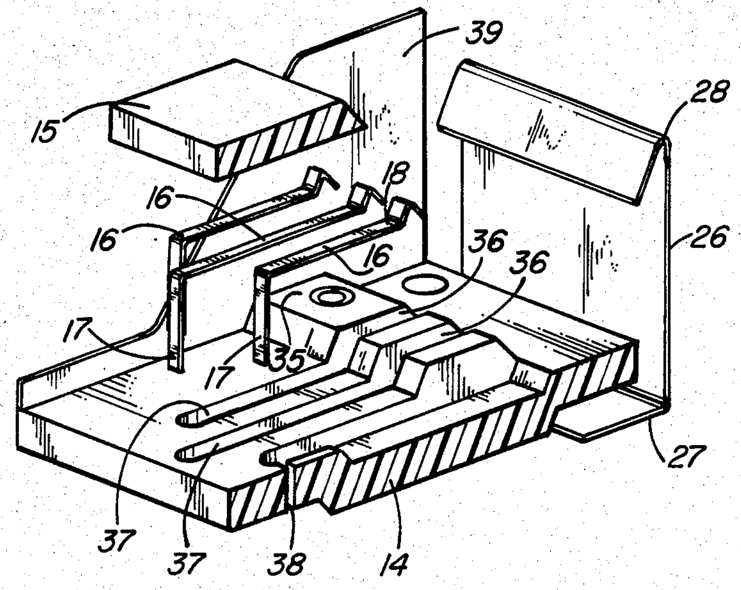
FIG. 3 is an exploded perspective view of a bottom member of a connector.
Figure 4:
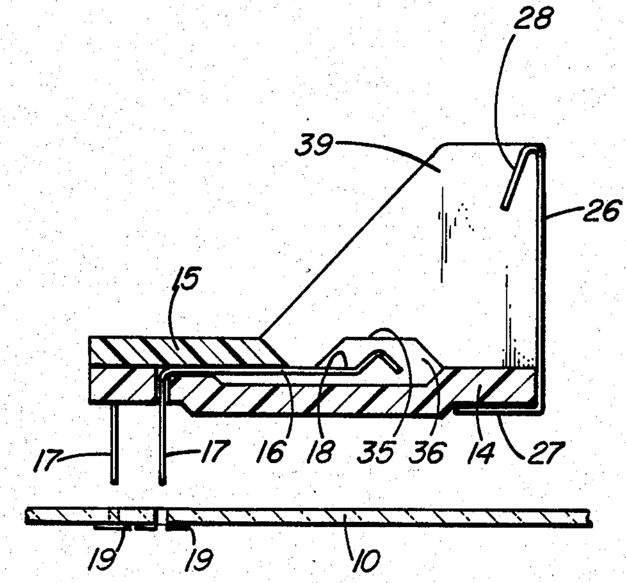
FIG. 4 is a cross-section of the bottom member of FIG. 3 in an assembled state, on the same line as FIG. 2.

FIGS. 3 and 4 illustrate the bottom member 12 in more detail, FIG. 3 illustrating the individual items and FIG. 4 showing the assembly. As seen in FIG. 3, the base 14 has a comb formation formed by a laterally extending rib 35 in which are formed slots 36. The slots are extended in the base top surface, in the form of grooves 37, to holes 38 through which the tail portions 17 of the contacts 16 pass. The slots 36 and grooves 37 position the contacts 16 along the connector. An upwardly extending web 39 at each end of the base 14, act to locate the cap 15, and also the top member 13. When assembled, as illustrated in FIG. 4, the cap 15 holds the contacts 16 down in the grooves 37 with the face ends of the contacts positioned in the comb formation. In the relaxed condition the contact portions 18 are positioned up from the bottom surfaces of the slots 36.

Figure 5:
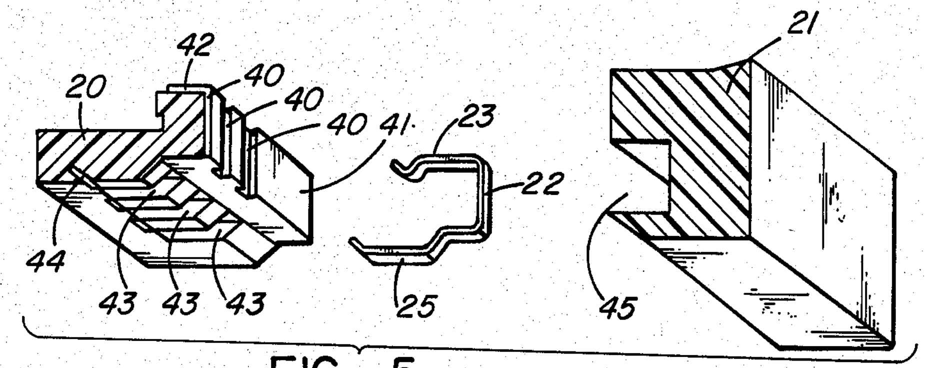
FIG. 5 is an exploded perspective view of a top member of a connector.
Figure 6:
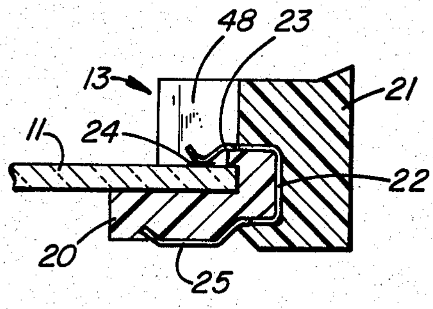
FIG. 6 is a cross-section of the top member of FIG. 5 in an assembled state, on the same line as FIG. 2.

FIGS. 5 and 6 illustrate the top member 13 in more detail. In FIG. 5 the various individual items are illustrated. The base 20 is formed with shallow grooves 40 extending down a front edge 41 and over a top surface 42. A comb formation is formed in the bottom surface of the base by slots 43, the slots 43 dimensioned and spaced to accept the parts of rib 35 of the bottom member between the slots 36. The contacts 22 fit in the grooves 40 on the front edge 41 and top surface 42 and along the bottom surface between the slots 43. The ends of the bottom legs 25 fit into recesses 44 in the base.

The channel member 21 has a longitudinal groove 45 which is a tight fit over the front portion of the base when the contacts 22 are assembled thereon. To assembly, the contacts are positioned on the base, sitting in the grooves 40, and the channel member 21 is pushed on, holding the contacts in position. This sub-assembly is normally supplied in an assembled condition. The daughter board and top member 13 are then assembled by sliding the top members on to the edge of the daughter board. The daughter board is located by rib 48 extending up at each end of the base 20. Small pins may be inserted through aligned holes in the ribs 48 and board 11 to retain in assembled condition. The ends of the upper legs 23 of the contacts 22 are then soldered to the contact pads on the daughter board, as by vapour phase soldering.

Figure 7:
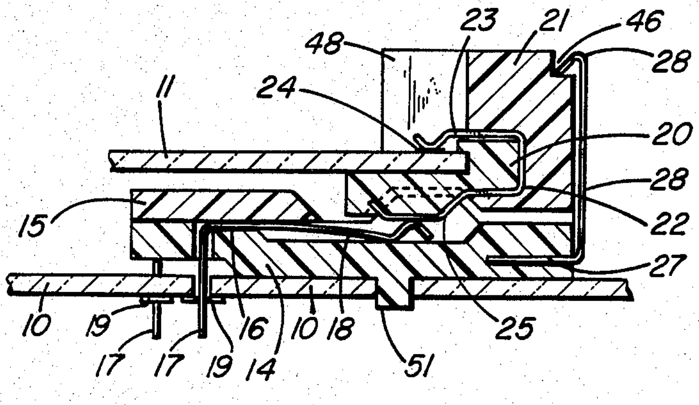
FIG. 7 is a cross-section similar to that of FIG. 2, illustrating some modifications.

FIG. 7 illustrates modifications of the connector illustrated in FIG. 2. No metal protector member is provided on the channel member, and a laterally extending recess 46 extends along the top edge of the channel member at its front surface. The hook 28 of the spring 26 snaps into the recess 46. The lower end 27 of the spring is inserted into a slot 47 in the base 14, instead of fitting under the base.

As stated, a connector is provided at opposite edges of a daughter board. In FIG. 1, connectors are indicated generally at 50. The bottom members 12 are attached to the mother board at predetermined positions, with the top members attached to opposite edges of daughter boards. A daughter board is mounted on the mother board by positioning one edge on the mother board, the daughter board inclined upward slightly. This will engage one channel member 21 under the hook 28 at that end. The daughter board is then rotated down and the outer edge of the channel member at the other edge will deflect the spring member 26 outward by pushing the hook outward. When the daughter board is fully in position, the hook will snap over. As the daughter board is mounted, the bottom legs 25 of the contacts 22 engage with and push down the cantilever portions 18 of the contacts 16. Removal of a daughter board is obtained by pulling back a spring 26 and lifting the daughter board at that edge. The board can then be disengaged at the other edge.

The base of the bottom member 12 is attached by screws extending up through the mother board into the base. The screws pass through holes in the lower end 27 of the spring. The positioning of the base 14 on the mother board 10 is initially provided by circular bosses on the bottom surface of the base which fit into holes in the mother board to give accurate location. This is seen at 51 in FIG. 7.

If necessary, to ensure that a daughter board is mounted on the right way round, that is, with correct orientation, keying can be provided. A simple way of obtaining this is to form a small protrusion at each end of a base at the front edge. A corresponding recess is formed at each end of a channel member. A base with protrusions is then positioned on the mother board to coincide with the channel member on a daughter board which has recesses. The channel member at the other edge of the daughter board would not have recesses and therefore complete assembly could not be obtained if the daughter board was not correctly oriented.

Figure 8:
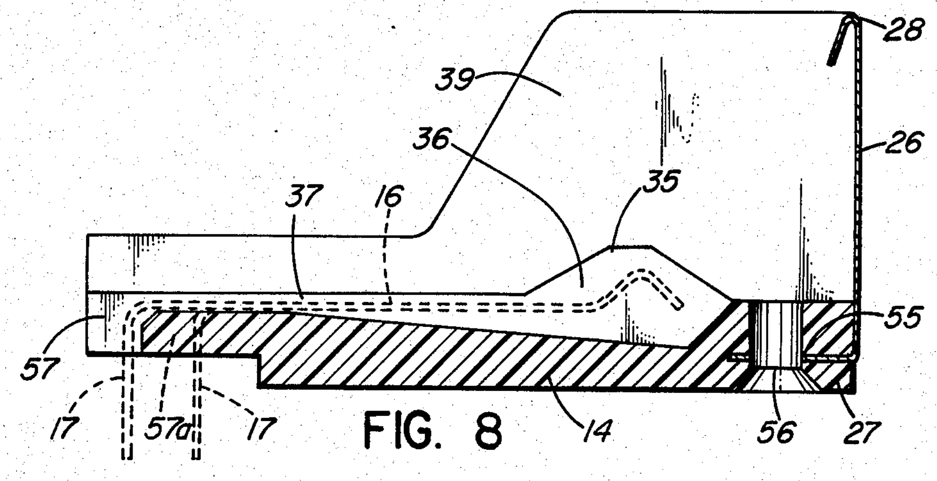
FIG. 8 is a cross-section through an alternative form of a base for a bottom member.
Figure 9:
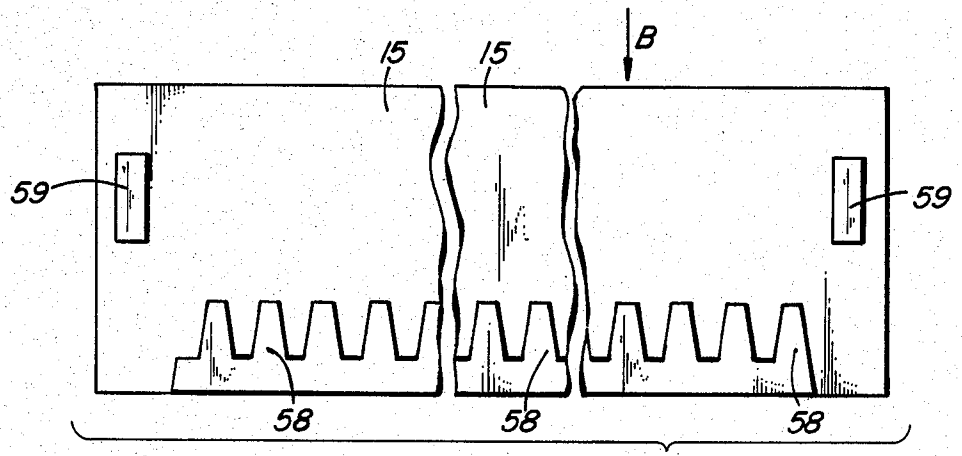
FIG. 9 is a bottom plan view, in the direction of arrow A in FIG. 10, of a cap to suit the base of FIG. 8.
Figure 10:
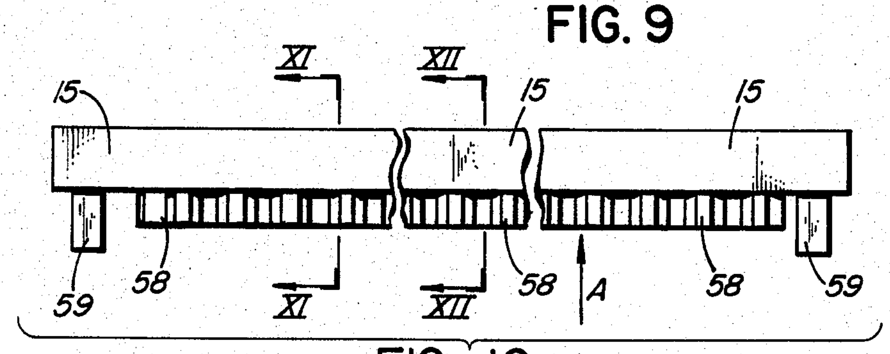
FIG. 10 is an end view in the direction of arrow B in FIG. 9.
Figure 11:
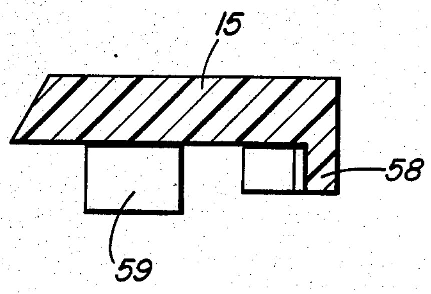
FIGS. 11 and 12 are cross-sections on the lines XI—XI and XII—XII respectively, on FIG. 10.
Figure 12:
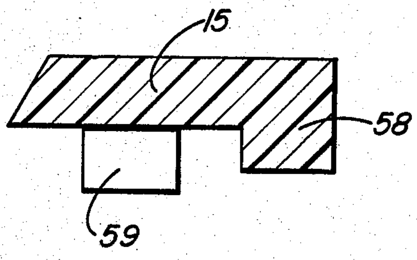

FIG. 8 illustrates an alternative form of base 14 and FIGS. 9 to 12 illustrate an alternative form of cap 15 to meet the base 14 of FIG. 8.

As illustrated in FIG. 8, the base 14 is molded with the spring 26 molded in situ. Holes 55 are formed in the lower end 27 of the spring, these holes 55 positioned to align with attachment holes 56 through the base. Slots 36 and grooves 37 are provided, as in the other forms of base, but in this example they extend to the edge of the base and cooperate with grooves 57 and 57*a* at the inner edge of the base. The tails 17 of the contacts are bent down to extend down the grooves 57 and 57*a* as indicated in dotted outline.

The cap 15 illustrated in FIGS. 9 to 12 has a comb formation at 58 which fits in the grooves 57 and 57*a* of the base. Two projections 59 fit into apertures in the base 14 to locate the cap relative to the base. The comb formation holds the contacts 16 in position during and after assembly of the bottom member.

Figure 13:
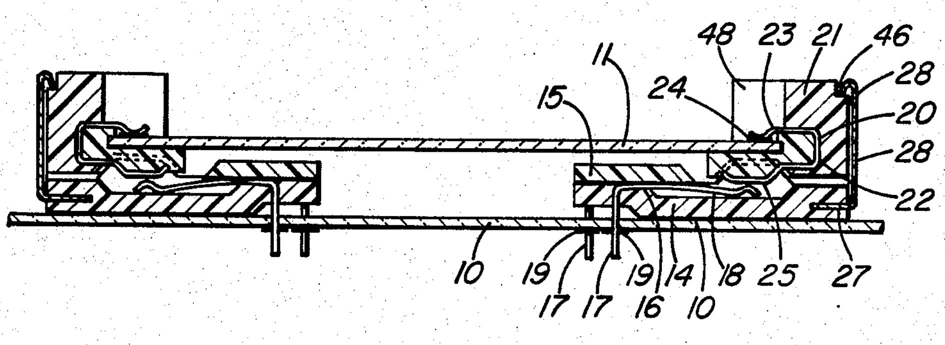
FIG. 13 is a cross-section through a daughter board mounted on a mother board, with a connector at each end of the daughter board.

FIG. 13 illustrates a daughter board 11 mounted on a mother board 10, with a connector at each end. Components on the daughter board are indicated in dotted outline at 60.

The connector has a very low profile, no higher than the height over components mounted on the daughter board. The contacts 22 can be at a close pitch, for example 0.050", while by staggering the tails 17 of contacts 16, the pitch of the contact areas of the conductor patterns 19 on the mother board can be 0.10".

The connectors at each end of a daughter board extend beyond the edges of the daughter board by a very small amount and very little clearance is required between connectors for adjacent daughter board. Sufficient clearance to move a spring 26 off the top member of a connector is all that is necessary. Very little space is required at the side of a daughter board also. The connectors can be as little as 0.060" longer than a daughter board and can be mounted in end-to-end contact. A clearance of 0.050" is sufficient between the spring 26. The overall height of a connector can be as low as 0.5".

What is claimed is:

1. A multiple contact connector, comprising;

an elongate bottom member for attachment to a circuit board and having top and bottom surfaces and inner and outer edges; a plurality of spring bottom contact members spaced apart along the bottom member, each bottom contact member including a cantilever contact portion extending over said top surface in a direction normal to the length of the bottom member and also including a tail portion extending through the bottom member and extending from said bottom surface for passage through said circuit board;

an elongate top member for attachment to an edge of a further circuit board and having top and bottom surfaces and an outer edge; a plurality of top contact members spaced apart along the top member, each top contact member having a bottom leg extending over said bottom surface of said top member in a direction normal to the length of said top member, and having a top leg extending over said top surface of said top member to make contact with contact pads on said further circuit board, the top contact members in said top member positioned to make contact with said cantilever contact portions of said bottom contact members in said bottom member on assembly of said top and bottom members together;

a spring member extending up from said bottom member along said outer edge and including a top portion adapted to extend over said outer edge of said top member and retain said top member on said bottom member.

2. A connector as claimed in claim 1, said bottom member comprising a bottom base having inner and outer edges and a cap positioned on said bottom base and extending along an inner edge of said bottom base, said cap attached to said bottom base and holding said bottom contact members in position.

3. A connector as claimed in claim 2, said bottom base including a comb formation extending lengthwise of the bottom base intermediate said inner and outer edges thereof, the comb formation composed of a plurality of alternating ribs and slots extending normal to the length of the bottom base, opposite ends of said slots being spaced from inner and outer edges of said bottom base, said cantilever contact portions of said bottom contact members being positioned in said slots, said tail portions of said bottom contact members extending through holes in said bottom base, said holes positioned between the inner ends of said slots and said inner edge of said bottom base.

4. A connector as claimed in claim 1, said top member including a top base having upper and outer edges and a channel member fitting over said outer edge, said top contact members being positioned between said channel member and said top base, and held in position thereby.

5. A connector as claimed in claim 4 said top base of said top member having a comb formation on its bottom surface, said comb formation comprising a plurality of slots extending normal to the length of the top member, said slots in the comb formation of said top member positioned to receive said ribs of said comb formation on said bottom base of said bottom member.

6. A connector as claimed in claim 1, said top portion of said spring member extending into a recess extending along a top surface of said outer edge of said top member.

7. A connector as claimed in claim 4, said top portion of said spring member extending into a recess extending along a top surface of said channel member.

8. A connector as claimed in claim 1, said spring member including an inwardly extending flange at its lower end, said flange extending beneath the bottom surface of said bottom member.

9. A connector as claimed in claim 1, said spring member including an inwardly extending flange at its lower end, said flange being positioned in a slot in said bottom member, said slot extending in from said outer edge.

10. A connector comprising:

an elongate bottom base member attached to a surface of a circuit board, said bottom base member having a top surface and inner and outer edges; a comb formation extending along said top surface of said bottom base member intermediate said inner and outer edges; said comb formation comprising a plurality of slots extending normal to the length of the bottom base member, said slots defining a plurality of ribs;

a plurality of spring bottom contact members on said bottom base member, each bottom contact member including a cantilever portion positioned in one of said slots and with a free end positioned towards said outer edge, each said bottom contact member further including a tail portion extending through said bottom base member adjacent said inner edge, the tail portions extending through said circuit board and connected to a circuit pattern on said circuit board;

an elongate cap positioned on said bottom base member, said cap extending outward from said inner edge of said bottom base member over an inner portion of each slot said cap holding said bottom contact members in position on said bottom base member;

an elongate top base member attached to an edge of a further circuit board, and having top and bottom surfaces and inner and outer edges; a comb formation on said bottom surface of said top base member and comprising a plurality of ribs extending normal to the length of the top base member, the ribs defining slots, said ribs of said comb formation on said top surface of said bottom base member positioned in the slots in said comb formation on said bottom surface of said top base member;

a plurality of top contact members on said top base member, each top contact member having a lower leg positioned on a rib of said comb formation on said bottom surface of said top base member and a top leg extending over the top surface of the top base member and on to a surface of said further circuit board, the ends of the top legs being soldered to contact pads on said circuit board, said top contact members each having intermediate portions extending over said outer edge of said top base member; said lower legs making contact with said cantilever portions of said bottom contact members on said bottom base member;

an elongate channel member extending over the outer edge of said top base member and holding the top contact members in position on said top base member, said channel member having top and bottom surfaces and inner and outer edges;

a spring member extending up from said bottom base member along said outer edge thereof, said spring member including a to portion extending inward, said top portion snapped over said channel member to hold said top base member and said channel member and said further circuit board in position on said bottom bas member and said circuit board.

11. A connector as claimed in claim 10 including an inwardly extending locating member at each end of said bottom base member for location of said top base member.

12. A connector as claimed in claim 10 including an inwardly extending locating member at each end of said top base member for location of said further circuit board.

* * * * *